(12) United States Patent
Taruishi et al.

(10) Patent No.: US 8,482,991 B2
(45) Date of Patent: *Jul. 9, 2013

(54) SEMICONDUCTOR DEVICE

(75) Inventors: Binhaku Taruishi, Tachikawa (JP);
Hiroki Miyashita, Higashimurayama (JP); Ken Shibata, Tokyo (JP); Masashi Horiguchi, Koganei (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/600,271

(22) Filed: Aug. 31, 2012

(65) Prior Publication Data

US 2012/0327723 A1    Dec. 27, 2012

Related U.S. Application Data

(60) Continuation of application No. 13/238,114, filed on Sep. 21, 2011, now Pat. No. 8,264,893, which is a continuation of application No. 12/710,394, filed on Feb. 23, 2010, now Pat. No. 8,031,546, which is a continuation of application No. 12/252,241, filed on Oct. 15, 2008, now Pat. No. 7,693,000, which is a continuation of application No. 11/174,655, filed on Jul. 6, 2005, now Pat. No. 7,453,738, which is a continuation of application No. 10/188,804, filed on Jul. 5, 2002, now Pat. No. 6,954,384, which is a division of application No. 10/023,891, filed on Dec. 21, 2001, now Pat. No. 6,424,590, which is a division of application No. 09/640,762, filed on Aug. 18, 2000, now Pat. No. 6,339,552.

(30) Foreign Application Priority Data

Aug. 31, 1999 (JP) ..................... 11-245821

(51) Int. Cl.
*G11C 7/1078* (2006.01)

(52) U.S. Cl.
USPC ...... 365/189.05; 365/193; 365/227; 365/229; 365/230.03; 365/233.1

(58) Field of Classification Search
None
See application file for complete search history.

(56) References Cited

U.S. PATENT DOCUMENTS 4,096,402 A  6/1978 Schroeder et al.
4,672,583 A  6/1987 Nakaizumi
(Continued)

FOREIGN PATENT DOCUMENTS

JP  9-27192   1/1997
JP  10-326488  12/1998
(Continued)

*Primary Examiner* — Tan T. Nguyen
(74) *Attorney, Agent, or Firm* — Miles & Stockbridge P.C.

(57) ABSTRACT

A data input buffer is changed from an inactive to an active state after the reception of instruction for a write operation effected on a memory unit. The input buffer is a differential input buffer having interface specs based on SSTL, for example, which is brought to an active state by turning on a power switch to cause a through current to flow and receives a signal therein while immediately following a small change in small-amplitude signal. Since the input buffer is brought to the active state only when the write operation's instruction for the memory unit is provided, it is rendered inactive in advance before the instruction is provided, whereby wasteful power consumption is reduced. In another aspect, power consumption is reduced by changing from the active to the inactive state in a time period from a write command issuing to a next command issuing.

2 Claims, 11 Drawing Sheets

U.S. PATENT DOCUMENTS

| | | |
|---|---|---|
| 4,794,564 A | 12/1988 | Watanabe |
| 4,858,188 A | 8/1989 | Kobayashi |
| 4,992,983 A | 2/1991 | Suzuki |
| 5,202,853 A | 4/1993 | Choi |
| 5,280,455 A | 1/1994 | Kanaishi |
| 5,313,120 A | 5/1994 | Pelley |
| 5,315,560 A | 5/1994 | Nishimoto et al. |
| 5,359,567 A | 10/1994 | Kondou |
| 5,379,257 A | 1/1995 | Matsumura et al. |
| 5,400,292 A | 3/1995 | Fukiage et al. |
| 5,426,381 A | 6/1995 | Flannagan et al. |
| 5,440,511 A | 8/1995 | Yamamoto et al. |
| 5,500,820 A | 3/1996 | Nakaoka |
| 5,508,643 A | 4/1996 | Khieu |
| 5,555,522 A | 9/1996 | Anami et al. |
| 5,563,832 A | 10/1996 | Kagami |
| 5,661,684 A | 8/1997 | Wong et al. |
| 5,661,691 A | 8/1997 | Lin |
| 5,691,955 A | 11/1997 | Yamauchi |
| 5,703,829 A | 12/1997 | Suzuki et al. |
| 5,801,554 A | 9/1998 | Momma et al. |
| 5,825,693 A | 10/1998 | Lee et al. |
| 5,880,998 A | 3/1999 | Tanimura et al. |
| 5,903,508 A | 5/1999 | Choi |
| 5,917,759 A | 6/1999 | Akashi |
| 5,940,330 A | 8/1999 | Kim |
| 5,955,896 A | 9/1999 | Horiguchi et al. |
| 6,011,751 A | 1/2000 | Hirabayashi |
| 6,016,283 A | 1/2000 | Jeong |
| 6,031,786 A | 2/2000 | Jang et al. |
| 6,038,189 A | 3/2000 | Morishita |
| 6,058,063 A | 5/2000 | Jang |
| 6,064,625 A | 5/2000 | Tomita |
| 6,115,322 A | 9/2000 | Kanda et al. |
| 6,118,729 A | 9/2000 | Hirabayashi et al. |
| 6,160,743 A | 12/2000 | Parris |
| 6,192,003 B1 | 2/2001 | Ohta et al. |
| 6,198,689 B1 | 3/2001 | Yamazaki |
| 6,208,582 B1 | 3/2001 | Kanda et al. |
| 6,240,048 B1 | 5/2001 | Matsubara |
| 6,242,940 B1 | 6/2001 | Na |
| 6,292,428 B1 | 9/2001 | Tomita et al. |
| 6,320,819 B2 | 11/2001 | Tomita et al. |
| 6,337,821 B1 | 1/2002 | Watanabe et al. |
| 6,337,822 B1 | 1/2002 | Kwak et al. |
| 6,339,552 B1 | 1/2002 | Taruishi et al. |
| 6,396,768 B2 * | 5/2002 | Ooishi ..................... 365/193 |
| 6,424,590 B1 | 7/2002 | Taruishi et al. |
| 6,466,492 B2 | 10/2002 | Ikeda |
| 6,819,602 B2 | 11/2004 | Seo et al. |
| 6,847,559 B2 | 1/2005 | Oh et al. |
| 6,954,384 B2 | 10/2005 | Taruishi et al. |
| 7,020,031 B2 | 3/2006 | Shin et al. |
| 7,453,738 B2 | 11/2008 | Taruishi et al. |
| 7,963,000 B2 | 6/2011 | Lai et al. |
| 8,031,546 B2 | 10/2011 | Taruishi et al. |

FOREIGN PATENT DOCUMENTS

| | | |
|---|---|---|
| JP | 11-16346 | 1/1999 |
| JP | 11-191292 | 7/1999 |
| JP | 11-195296 | 7/1999 |
| JP | 11-288590 | 10/1999 |

\* cited by examiner

SEMICONDUCTOR DEVICE

CROSS-REFERENCE TO RELATED APPLICATION

This application is a continuation of application Ser. No. 13/238,114 filed Sep. 21, 2011 (now U.S. Pat. No. 8,264, 893), which is a continuation of application Ser. No. 12/710, 394 filed Feb. 23, 2010 (now U.S. Pat. No. 8,031,546), which is a continuation of application Ser. No. 12/252,241 filed Oct. 15, 2008 (now U.S. Pat. No. 7,693,000 issued Apr. 6, 2010), which is a continuation of application Ser. No. 11/174,655 filed Jul. 6, 2005 (now U.S. Pat. No. 7,453,738 issued Nov. 18, 2008), which is a continuation of application Ser. No. 10/188,804 filed Jul. 5, 2002 (now U.S. Pat. No. 6,954,384 issued Oct. 11, 2005), which is a division of application Ser. No. 10/023,891 filed Dec. 21, 2001 (now U.S. Pat. No. 6,424, 590 issued Jul. 23, 2002), which is a division of application Ser. No. 09/640,762 filed Aug. 18, 2000 (now U.S. Pat. No. 6,339,552 issued Jan. 15, 2002).

BACKGROUND OF THE INVENTION

The present invention relates to a technique for inputting information which is suitable for use in a semiconductor device supplied with the information, e.g., a technique effective for application to a DDR (Double Data Rate)-operable SDRAM (Synchronous Dynamic Random Access Memory).

With the speeding up of operation, an external interface such as an SDRAM is now migrating toward a small-amplitude signal interface like SSTL (Stub Series Terminated Transceiver Logic). A differential amplifier circuit provided with a current mirror load has widely been adopted for an input buffer of the SSTL specs-based interface. Since a through current always flows in the differential amplifier circuit in an active state, the differential amplifier circuit increases power consumption as compared with a CMOS input buffer comprising a complementary type MOS circuit, but is capable of receiving a small signal therein at high speed.

In a synchronous memory like the SDRAM, timing provided to operate it is controlled based on an external clock signal like an externally supplied system clock signal. This type of synchronous memory has the feature that the setting of internal operating timings by the use of the external clock signal becomes relatively easy and a relatively high-speed operation is made possible.

As the SDRAM used herein, there are known a so-called SDR (Single Data Rate) type SDRAM wherein the input and output of data are performed in synchronism with the rising edge of an external clock signal, and a so-called DDR type SDRAM wherein the input and output of data are carried out in synchronism with both the rising and falling edges of an external clock signal.

SUMMARY OF THE INVENTION

The SDR type SDRAM and the DDR type SDRAM are different from each other in terms of input timing control for writing data. The supply of data from the outside in a clock signal cycle identical to that for external instructions for a write operation is defined or provided for the SDR type SDRAM. Since instruction for a write operation by a write command following a bank active command is provided and simultaneously write data is supplied, the activation of a data input buffer after the reception of the write command will not suffice for the input of the write data supplied in synchronism with the clock signal together with the write command. Thus, the data input buffer is activated when it has accepted a bank active command for providing instructions for the operation of a row address system.

On the other hand, the supply of data from the outside, synchronized with a data strobe signal as viewed from a clock signal cycle subsequent to a clock signal cycle at which external instruction for a write operation is provided, is defined or provided for the DDR type SDRAM. The data strobe signal is used even for data output. The use of such a data strobe signal and the proper setting of a delay in propagation of data and a delay in propagation of the data strobe signal to each individual SDRAM on a memory board relatively facilitate a reduction in variations in distance-dependent time required to access data from a memory controller to each SDRAM on the memory board.

The present inventors have discussed control on the activation of the data input buffer employed in the DDR type SDRAM. According to their discussions, it has been revealed by the present inventors that when the data input buffer is activated in response to a bank active command in a manner similar to the SDR type even in the case of the DDR type SDRAM, the data input buffer is subsequently kept in an active state until a precharge command is accepted, for example, and the data input buffer wastefully consumes or uses up power during a period in which a write command is issued after the bank active command. It has also been revealed by the present inventors that the write command is not necessarily issued after the bank active command, and when no write command is issued, the activated state of the data input buffer comes to nothing as a consequence and the power consumed by the data input buffer is entirely wasted. The adoption of an SSTL interface for the data input buffer of the DDR-SDRAM is defined or provided by JEDEC (Joint Electron Device Engineering Council). It has been found out by the present inventors that if a case which complies with this definition is taken into consideration, then control timing provided to activate the input buffer of the SSTL interface leads to a large element with a view toward achieving low power consumption of the DDR-SDRAM.

An object of the present invention is to provide a semiconductor device capable of reducing the consumption of power by an external interface buffer such as a data input buffer or the like.

Another object of the present invention is to provide a semiconductor device suitable for use in a DDR type SDRAM which has planned low power consumption.

The above, other objects and novel features of the present invention will become apparent from the description of the present specification and the accompanying drawings.

A summary of a typical one of the embodiments disclosed in the present application will be described in brief below.

In a semiconductor device having a data input buffer capable of inputting write data to each of memory units, the data input buffer is changed from an inactive state and an active state after having accepted instruction for writing of the data into the memory unit.

Although not restricted in particular, the semiconductor device may be a clock synchronous semiconductor device such as an SDRAM, which performs the operation of writing data into a plurality of memory cells and the operation of reading data therefrom in response to a clock signal.

The data input buffer is a differential input buffer having interface specs based on an SSTL standard, for example. The corresponding buffer is brought to an active state by the turning on of its power switch and brought to an inactive state by the turning off thereof. The input buffer typified by the differential input buffer allows a through current to flow in its active state and is capable of immediately following even a small change in a small-amplitude input signal and transferring the input signal to a subsequent stage.

Since such an input buffer is brought to the active state only when instruction for the writing of the data into the memory unit is given thereto, wasteful power consumption that would occur by the data input buffer being brought to the active state in advance before the instruction for the write operation is provided, is avoided.

BRIEF DESCRIPTION OF THE DRAWINGS

While the specification concludes with claims particularly pointing out and distinctly claiming the subject matter which is regarded as the invention, it is believed that the invention, the aforementioned objects and features of the invention and further objects, features and advantages thereof will be better understood from the following description taken in connection with the accompanying drawings in which:

DETAILED DESCRIPTION OF THE INVENTION

Figure 1:
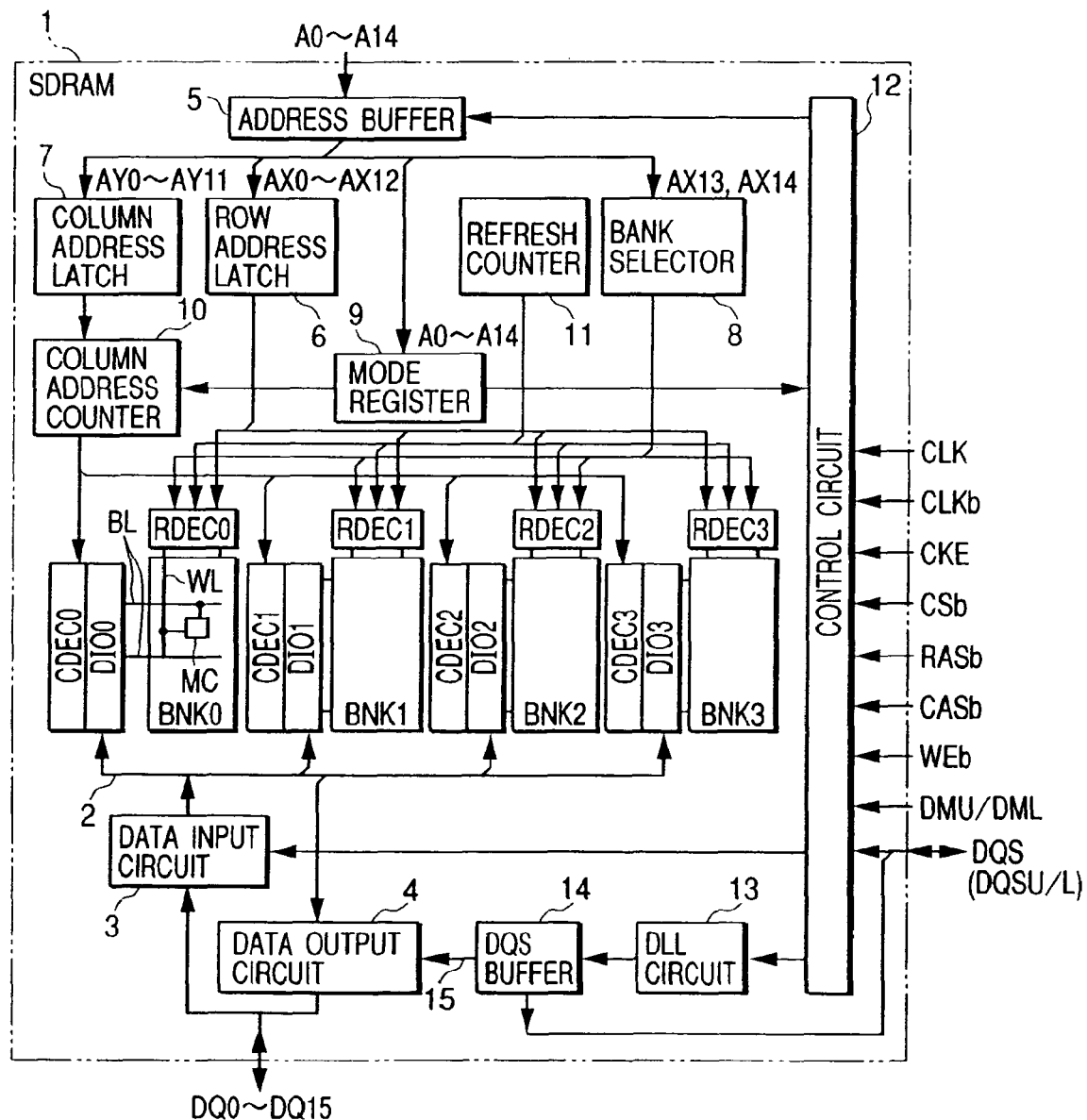
FIG. 1 is a block diagram showing a DDR-SDRAM illustrative of one example of a semiconductor device according to the present invention.

In an SDRAM illustrative of a preferred embodiment of a semiconductor device according to the present invention, a control circuit for controlling the operation of writing data into each memory cell and the operation of reading out data therefrom is operated as follows. A data write operation used to specify each of bit lines by a column address is specified or instructed by a write command. A word line selecting operation based on a row address is instructed by a bank active command. A data read operation used to specify each bit line by a column address is instructed by a read command. The initialization of each word line is instructed by a precharge command. After the reception of the write command, the data input buffer is changed from an inactive state to an active state, and the state of the data input buffer held in the inactive state is rendered invariant even if the bank active command or the read command is accepted. Thus, since the instructions based on the bank active command and the read command do not activate the data input buffer, no wasteful power consumption occurs in the data input buffer if the write command is not given at all after the execution of the bank active command.

When the supply of data, synchronized with a data strobe signal as viewed from a clock signal cycle subsequent to the clock signal cycle at which instruction for a write operation based on a write command is provided, is defined as in the case where the semiconductor device according to the present invention is a DDR type SDRAM, the semiconductor device has, for example, a data latch circuit provided at a stage subsequent to the data input buffer. The data latch circuit latches data supplied in synchronism with the data strobe signal therein in synchronism with the data strobe signal. Judging from one viewpoint, such data input specs as described above in the semiconductor device assure the non-occurrence of a failure to take the input of write data even if the data input buffer is activated subsequently to the instruction for the write operation by the clock-synchronized write command.

When the input/output of data is made possible in synchronism with both rising and falling edges of a data strobe signal synchronized with a clock signal as in the case of the DDR type SDRAM, the data latch circuit successively latches data inputted to the data input buffer in synchronism with changes of the rising and falling edges of the data strobe signal, for example, and makes it possible to supply the data to the memory cells in parallel with one or more cycles of the data strobe signal as units. A data latch circuit illustrative of a further specified form includes a first data latch circuit for latching the data inputted from the data input buffer therein in synchronism with the change of the rising edge of the data strobe signal, a second data latch circuit for latching the data inputted from the data input buffer therein in synchronism with the change of the falling edge of the data strobe signal, and a third data latch circuit for latching the data latched in the first data latch circuit therein in synchronism with the change of the falling edge of the data strobe signal. The outputs of the second data latch circuit and the third data latch circuit can be supplied to the memory unit while being held in parallel.

Once write data is captured inside from the data input buffer, the data input buffer is no longer kept in an active state even if the write operation is not yet completed. Thus, if low power consumption of the data input buffer is given top priority, then the data input buffer may be transitioned from an active state to an inactive state after the latching of the final write data for a write operation based on a write command in the second and third data latch circuits. This control can be carried out in synchronism with the data strobe signal. However, if one attempts to maintain the reliability of the write operation even when the relationship between the data strobe signal and a set-up hold time for write data is undesirably changed, then the data input buffer may be transitioned from the active state to the inactive state in synchronism with the completion of the write operation based on the write command.

Input buffer control as viewed from the standpoint similar to the data input buffer can be applied even to an address input buffer or the like. Now consider, as an example, a semiconductor device including, for example, a plurality of or plural address input terminals, plural address input buffers provided in association with the plural address input terminals, a clock terminal for receiving a clock signal, plural memory cells having select terminals electrically connected to their corresponding word lines and data input/output terminals electrically connected to their corresponding bit lines, and a control circuit for controlling the operation of writing data into the memory cells and the operation of reading data therefrom in synchronism with the clock signal. In this case, the control circuit is operated as follows. A word line selecting operation based on a row address is specified or instructed by a bank active command. A data read operation used to specify each bit line by a column address is instructed by a read command. A data write operation used to specify each bit line by a column address is instructed by a write command. The initialization of each word line is instructed by a precharge command. After the reception of the bank active command, the read command or the write command, the address input buffer is changed from an inactive state to an active state. Thereafter, the address input buffer may be changed from the active state to the inactive state after the elapse of a fixed cycle period synchronized with the clock signal.

<<Summary of DDR-SDRAM>>

FIG. 1 shows a DDR type SDRAM (DDR-SDRAM) as one example of a semiconductor device according to the present invention. Although not restricted in particular, the DDR-SDRAM shown in the same drawing is formed over one semiconductor substrate like monocrystalline silicon by the known MOS semiconductor integrated circuit manufacturing technology.

Although not restricted in particular, the DDR-SDRAM 1 has four memory banks BNK0 through BNK3. Although not shown in the drawing, the respective memory banks BNK0 through BNK3 respectively have four memory mats although not restricted in particular. The respective memory mats comprise two memory arrays respectively. One of the two memory arrays is assigned to a region or area for storing data in which the least significant bit of a column address signal corresponds to a logical value "0", whereas the other thereof is assigned to an area for storing data in which the least significant bit of the column address signal corresponds to a logical value "1". A separation or block structure of the memory mats and memory arrays for each memory bank is not necessarily limited to the above. Unless otherwise noted in particular in the present specification, each individual memory bank will therefore be described as comprising one memory mat respectively.

The memory mats of the respective memory banks BNK0 through BNK3 are respectively provided with dynamic memory cells MC placed in matrix form. According to the drawing, select terminals of the memory cells MC placed in the same column are connected to a corresponding one of word lines WL provided for every column. Further, each of data input/output terminals of the memory cells placed in the same row is connected to one of complementary bit lines BL and BL for each row. While only some of the word lines WL and the complementary bit lines BL are typically illustrated in the same drawing, they are actually placed in large numbers in matrix form. Each memory mat has a folded bit line structure with sense amplifiers as the center.

Row decoders RDEC0 through RDEC3, data input/output circuits DIO0 through DIO3, and column decoders CDEC0 through CDEC3 are provided for the respective memory banks BNK0 through BNK3.

Each of the word lines WL in each memory mat is selected according to the result of decoding of a row address signal by each of the row decoders RDEC0 through RDEC3 provided for the respective memory banks BNK0 through BNK3 and driven to a selection level.

The data input/output circuits DIO0 through DIO3 respectively have sense amplifiers, column selection circuits and write amplifiers. The sense amplifier is an amplifier circuit for detecting and amplifying a small potential difference developed between the complementary bit lines BL and BL according to the reading of data from each memory cell MC. The column selection circuit is a switch circuit for selecting the complementary bit lines BL and BL and bringing the selected bit line and an input/output bus 2 as a complementary common data line into conduction. The column selection circuit is selectively activated according to the result of decoding of a column address signal by the corresponding one of the column decoders CDEC0 through CDEC3. The write amplifier is a circuit for amplifying the difference in potential between the adjacent complementary bit lines BL and BL through a column switch circuit according to write data.

A data input circuit 3 and a data output circuit 4 are connected to the input/output bus 2. The data input circuit 3 takes write data supplied from outside in a write mode and transfers it to the input/output bus 2. The data output circuit 4 receives read data transferred from each memory cell MC to the input/output bus 2 in a read mode and outputs it to the outside. Although not restricted in particular, input terminals of the data input circuit 3 and output terminals of the data output circuit 4 are connected to 16-bit data input/output terminals DQ0 through DQ15 respectively. For convenience of description, numerals designated at DQ0 through DQ15 might be described with being assigned to data inputted from and outputted to the outside by the SDRAM 1.

Although not restricted in particular, the DDR-SDRAM 1 has 15-bit address input terminals A0 through A14. The address input terminals A0 through A14 are connected to an address buffer 5. Of address information supplied to the address buffer 5 in multiplex form, row address signals AX0 through AX12 are supplied to a row address latch 6, column address signals AY0 through AY11 are supplied to a column address latch 7, bank select signals AX13 and AX14 regarded as bank selection signals are supplied to a bank selector 8, and mode register set information A0 through A14 are supplied to a mode register 9, respectively.

Any of the operations of the four memory banks BNK0 through BNK3 is selected by the bank selector 8 according to the logical values of the bank select signals AX13 and AX14. Namely, only the memory bank whose operation is selected, is capable of memory operation. For example, the sense amplifiers, the write amplifiers and the column decoders or the like are not activated for the non-selected memory banks.

The row address signals AX0 through AX12 latched in the row address latch 6 are supplied to the row address decoders RDEC0 through RDEC3.

The column address signals AY0 through AY11 latched in the column address latch 7 are preset to a column address counter 10, followed by supply to the column address decoders CDEC0 through CDEC3. When a burst access corresponding to a continuous memory access is specified, the column address counter 10 is incremented by the continuous number of times (the number of bursts), whereby column address signals are generated thereinside.

A refresh counter 11 is an address counter which itself generates a row address for performing a refresh operation for stored information. When the refresh operation is specified, the corresponding word line WL is selected according to the row address signal outputted from the refresh counter 11 to thereby refresh the stored information.

Although not restricted in particular, the control circuit 12 is supplied with predetermined information from the mode register 9 together with external control signals such as clock signals CLK and CLKb, a clock enable signal CKE, a chip select signal CSb (whose suffix b means that a signal marked with b is a row enable signal or a level inverse signal), a column address strobe signal CASb, a row address strobe signal RASb, a write enable signal WEb, data mask signals DMU and DML, a data strobe signal DQS, etc. The operation of the DDR-SDRAM 1 is determined by a command defined according to a combination of the states of those input signals. The control circuit 12 has control logic for forming or producing internal timing signals corresponding to the operation specified by the command.

The clock signals CLK and CLKb are defined as master clocks for the SDRAM, and other external input signals are rendered significant in synchronism with the rising edge of the clock signal CLK.

The chip select signal CSb provides instructions for starting a command input cycle according to its low level. When the chip select signal is of a high level (chip non-selected state), other inputs are ineffective. However, the state of selection of each memory bank, and internal operations such as a burst operation, etc. to be described later are not affected by a change in the chip non-selected state.

Each of the signals RASb, CASb and WEb is different in function from its corresponding signal in the DRAM and is defined as a signal significant when command cycles to be described later are defined.

The clock enable signal CKE is a control signal used in a power down mode and a self refresh mode. In the power down mode (also called a data retention mode in the SDRAM), the clock enable signal CKE is rendered low in level.

The data mask signals DMU and DML are mask data represented in byte units with respect to the input write data. The high level of the data mask signal DMU provides instructions for inhibiting the writing of the write data by an upper or high-order byte, whereas the high level of the data mask signal DML provides instructions for inhibiting the writing of the write data by a lower or low-order byte.

The data strobe signal DQS is externally supplied as a write strobe signal upon the write operation. Namely, when the write operation is specified in synchronism with the clock signal CLK, the supply of data synchronized with the data strobe signal DQS as viewed from a clock signal cycle subsequent to the clock signal cycle at which the instructions for the write operation is provided, is defined. Upon the read operation, the data strobe signal DQS is outputted to the outside as a read strobe signal. Namely, the data strobe signal changes in synchronism with the external output of the read data upon a data read operation. To this end, the DLL (Delayed Lock Loop) circuit 13 and the DQS output buffer 14 are provided. The DLL circuit 13 controls or arranges the phase of a clock signal (corresponding to a control clock signal being in phase with the data strobe signal DQS upon the read operation) 15 to synchronize the clock signal CLK received by the semiconductor device 1 with timing provided to output data from the data output circuit 4. Although not restricted in particular, the DLL circuit 13 reproduces the internal clock signal 15 capable of compensating for a signal propagation delay time characteristic of an internal circuit by replica circuit technology and phase lock technology. Thus, the data output circuit 4, which performs an output operation based on the internal clock signal 15, is capable of outputting data with timing synchronized with the external clock signal CLK with reliability. The DQS buffer 14 outputs a data strobe signal DQS to the outside in phase with the internal clock signal 15.

The row address signals (AX0 through AX12) are respectively defined by levels at the address input terminals A0 through A12 in a row address strobe/bank active command (active command) cycle to be described later, which is synchronized with the rising edge of the clock signal CLK. In the active command cycle, the signals AX13 and AX14 inputted from the address input terminals A13 and A14 are regarded as the bank select signals. When A13=A14="0", the bank BNK0 is selected, when A13="1" and A14="0", the bank BNK1 is selected, when A13="0" and A14="1", the bank BNK2 is selected, and when A13="1" and A14="1", the bank BNK3 is selected, respectively. Each memory bank selected in this way is regarded as an object for reading of data by the read command, writing of data by the write command or precharge by the precharge command.

The column address signals (AY0 through AY11) are respectively defined by levels at the terminals A0 through A11 in a column address/read command (read command) cycle and a column address/write command (write command) cycle to be described later, which are synchronized with the rising edge of the clock signal CLK. A column address specified by each level is defined as a start address for burst access.

Although not restricted in particular, the following commands designated at [1] through [9] and the like are defined for the DDR-SDRAM 1 in advance.

[1] A mode register set command is a command for setting the mode register 9. The present command is specified by CSb, RASb, CASb and WEb=low level, and respective data (register set data) to be set are supplied through A0 through A14. Although not restricted in particular, the respective register set data are defined as a burst length, CAS latency, a burst type, etc. Although not restricted in particular, the settable burst length takes 2, 4 and 8 clock cycles. The settable CAS latency takes 2 and 2.5 although not restricted in particular.

The CAS latency indicates what cycles of the clock signal CLK are wasted from the falling edge of the CASb to the output operation of the data output circuit 4 upon a read operation specified by the column address/read command to be described later. Since an internal operation time used for the reading of data is required until the read data is established or determined, the CAS latency is used to set the internal operation time according to the use frequency of the clock signal CLK. In other words, when a clock signal CLK of a high frequency is used, the CAS latency is set to a relatively large value. On the other hand, when a clock signal CLK low in frequency is used, the CAS latency is set to a relatively small value.

[2] A row address strobe/bank active command is a command for providing instructions for a row address strobe and validating the selection of memory banks, based on A13 and A14. This command is specified according to CSb and RASb=low level ("0") and CASb and WEb=high level ("1"). At this time, addresses supplied to A0 through A12 are captured as row address signals, whereas signals supplied to A13 and A14 are captured as signals for selecting the memory banks. Their capture operations are executed in synchronism with the rising edge of the clock signal CLK as described above. When the corresponding command is specified, for example, a word line in a memory bank specified by the command is selected. Thus, memory cells connected to the corresponding word line and their corresponding complementary bit lines are brought into conduction.

A column address/read command is a command required to start a burst read operation. Further, this is also a command for providing instructions for a column address strobe. The present command is specified according to CSb and CASb=low level and RASb and WEb=high level. Addresses supplied to A0 through A11 at this time are captured as column address signals respectively. Thus, the captured column address signals are preset to the column address counter 10 as burst start addresses. Before the burst read operation specified thereby, a memory bank and a word line lying therein have been selected in the row address strobe/bank active command cycle. In this state, memory cells connected to the selected word line are successively selected in each memory bank in, for example, 32-bit units in accordance with each address signal outputted from the column address counter 10 in synchronism with the clock signal CLK. Further, items of data therein are sequentially outputted to the outside in 16-bit units in synchronism with the rising and falling edges of the data strobe signal DQS. The number of the sequentially-read data (the number of words) is set as a number specified by the above burst length. The data output circuit 4 starts data reading while waiting for the number of cycles in the clock signal CLK defined by the CAS latency.

[4] A column address/write command is set necessary to start the corresponding burst write operation when the burst write is set to the mode register 9 as a write operation mode. Further, the corresponding command provides instructions for a column address strobe at the burst write. The corresponding command is specified according to CSb, CASb and WEb=low level and RASb=high level. Addresses supplied to A0 through A11 at this time are captured as column address signals. Thus, the captured column address signals are supplied to the column address counter 10 as burst start addresses upon the burst write. The procedure of the burst write operation specified thereby is also performed in a manner similar to the burst read operation. However, no CAS latency is set to the write operation and the capturing of the write data is started in synchronism with the data strobe signal DQS with a delay of one cycle of the clock signal CLK as seen from the column address/write command cycle.

[5] A precharge command is defined as a command for starting a precharge operation on each memory bank selected by A13 and A14. This command is specified by CSb, RASb and WEb=low level and CASb=high level.

[6] An autorefresh command is a command required to start autorefresh and specified by CSb, RASb and CASb=low level and WEb and CKE=high level. A refresh operation defined thereby is similar to CBR refresh.

[7] When a self refresh entry command is set, a self-refresh function works during a period in which CKE is low in level. During that period, the refresh operation is automatically performed at predetermined intervals even if refresh instructions are not provided from outside.

[8] A burst stop command is a command required to stop a burst read operation. This command is ignored in burst operations. This command is specified by CASb and WEb=low level and RASb and CASb=high level.

[9] A no-operation command is a command for indicating the non-execution of a substantial operation and specified by CSb=low level and RASb, CASb and WEb=high level.

When another memory bank is specified in the course of the burst operation and the row address strobe/bank active command is supplied when the burst operation is being performed with one memory bank in the DDR-SDRAM 1, the operation of a row address system in another memory bank is made possible without exerting any influence on the operation of one memory bank being in execution. Namely, a row address system operation designated by the bank active command or the like and a column address system operation specified by the column address/write command or the like can be rendered parallel between the different memory banks. Thus, unless data collide with one another at the data input/output terminals DQ0 through DQ15, the precharge command and the row address strobe/bank active command are issued to a memory bank different from a memory bank to be processed by a process-uncompleted command being in execution while the command is in execution, thereby making it possible to start an internal operation in advance.

As is apparent from above description, the DDR-SDRAM 1 makes it possible to perform data input/output synchronized with both the rising and falling edges of the data strobe signal DQS synchronized with the clock signal CLK and input and output addresses and control signals in synchronism with the clock signal CLK. Therefore, a large capacity memory similar to the DRAM can be operated at high speed equivalent to that for the SRAM. Accessing several data for the selected one word line is specified by the burst length, whereby the built-in column address counter 10 successively performs switching between selected states of column systems, thereby making it possible to continuously read or write a plurality of pieces of data.

<<SSTL Interface>>

In the DDR-SDRAM 1, although not restricted in particular, interfaces for an input buffer supplied with the clock signal CLK, inverse clock signal CLKb, clock enable signal CKE, chip select signal CSb, RAS signal RASb, CAS signal CASb, write enable signal WEb, address input signals A0 through A14, data mask signal DM, and data strobe signal DQS, a data input buffer of the data input circuit 3, and a data output buffer of the data output circuit 4 comply with, for example, the known SSTL2 (Class II) standard.

Figure 2:
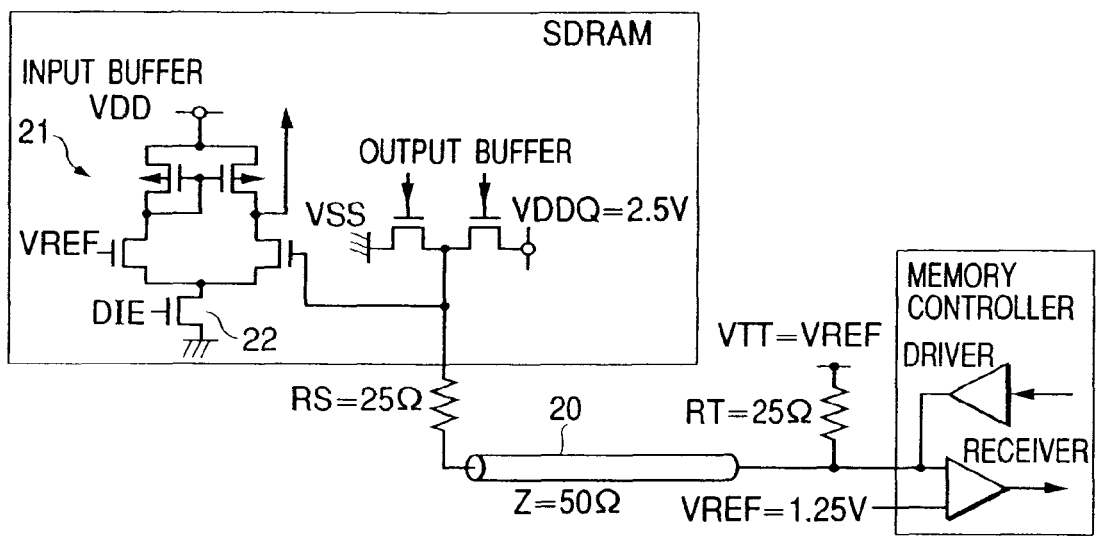
FIG. 2 is a circuit diagram illustrating an example of a circuit configuration of an SSTL2 (Class II)

FIG. 2 shows an example of a circuit configuration of an SSTL2 (Class II). A transmission line 20 having a characteristic impedance of 50Ω is pulled up by a reference voltage VREF and thereby electrically connected to, for example, a memory controller or an SDRAM or the like. An input buffer of the SDRAM is configured as a differential input buffer 21. The transmission line 20 is connected to one of the differential inputs thereof, whereas the reference voltage VREF is applied to the other thereof. A power switch 22 is activated and controlled based on an enable signal DIE. A source voltage VDD is set to 3.3 V, for example, and a ground voltage VSS in the circuit is set to 0V. An output buffer is provided, at an output stage, with a CMOS inverter with a source voltage VDDQ=2.5V and the ground voltage VSS as operating sources or supplies. The memory controller has a driver and a receiver both of which satisfy the interface specs. The driver drives the transmission line 20 and the receiver receives data from the transmission line 20.

Figure 3:
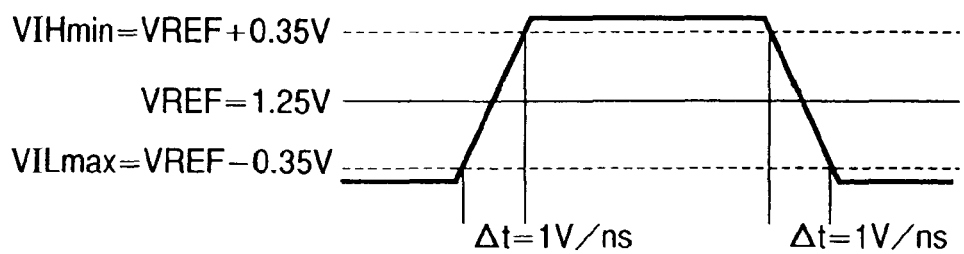
FIG. 3 is an explanatory diagram depicting a standard on a signal in SSTL2 (Class II) as an illustrative example.

FIG. 3 shows a standard on a signal in the SSTL2 (Class II) as an illustrative example. In the SSTL2 standard, a level of 1.6 volts or more, which is higher than the reference voltage (VREF) like 1.25 volts by 0.35V or higher, is regarded as an H level. A level lower than the reference potential or voltage by 0.35V or less, i.e., a level of 0.90V or less is regarded as an L level. The above specific levels are typified by way of example and may be levels which comply with an SSTL3 standard, for example.

Figure 4:
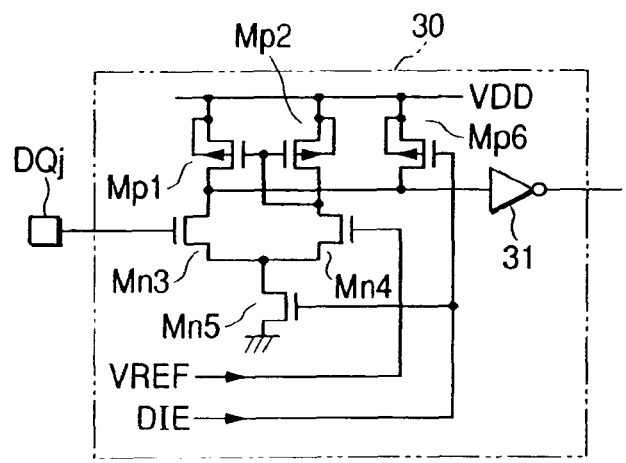
FIG. 4 is a circuit diagram showing an input first-stage buffer of a data input circuit illustrative of a specific example of a differential input buffer based on SSTL.

FIG. 4 shows an input first-stage buffer of the data input circuit 3 as a specific example of the differential input buffer based on the SSTL. The differential input buffer 30 has a differential amplifier circuit which comprises a current mirror load comprised of p channel MOS transistors Mp1 and Mp2, n channel differential input MOS transistors Mn3 and Mn4 electrically connected the drains of the MOS transistors Mp1 and Mp2, and an n channel power switch MOS transistor Mn5 electrically connected to the common sources of the differential input MOS transistors Mn3 and Mn4.

The gate of one differential input MOS transistor Mn3 is electrically connected to a data terminal DQj (where j=0 to 15), and the gate of the other differential input MOS transistor Mn4 is electrically connected to a reference voltage VREF. An output node of the differential amplifier circuit can selectively be precharged to a source voltage VDD by a p channel precharge MOS transistor Mp6. A signal at the node is inverted through an inverter 31 and outputted therefrom.

A signal DIE is an enable control signal for the differential input buffer 30, and is supplied to the gates of the power switch MOS transistor Mn5 and the precharge MOS transistor Mp6. The differential input buffer is activated by a high level of the enable control signal DIE. In its activated state, an operating current flows in the differential amplifier circuit, whereby the differential amplifier circuit immediately amplifies a small potential difference between the reference voltage VREF and the level of a signal at the terminal DQj with the reference voltage VREF as the center. The operation of inputting the signal from the terminal DQj is carried out at high speed because of the differential amplification. The differential input buffer is deactivated by a low level of the enable control signal DIE. In the deactivated state of the differential input buffer, no power consumption is developed in the differential amplifier circuit, and the output of the inverter 31 is also forcibly brought to a low level by the action of the precharge MOS transistor Mp6 kept in an on state.

The enable control signal DIE is asserted from a low to a high level after the instruction for the write operation by the write command is given to the DDR-SDRAM 1. Thus, since the differential input buffer 30 is activated after the instruction for the write operation by the write command, it does not consume or use up power wastefully before the instruction for the write operation. Further, even if the bank active command or read command is accepted, the state of the data input buffer kept in the deactivated state remains unchanged. Since the differential input buffer 30 is not activated under the instructions based on the bank active command or read command, the differential input buffer 30 does not perform any wasteful power consumption if the write command is not given at all after the bank active command.

Figure 5:
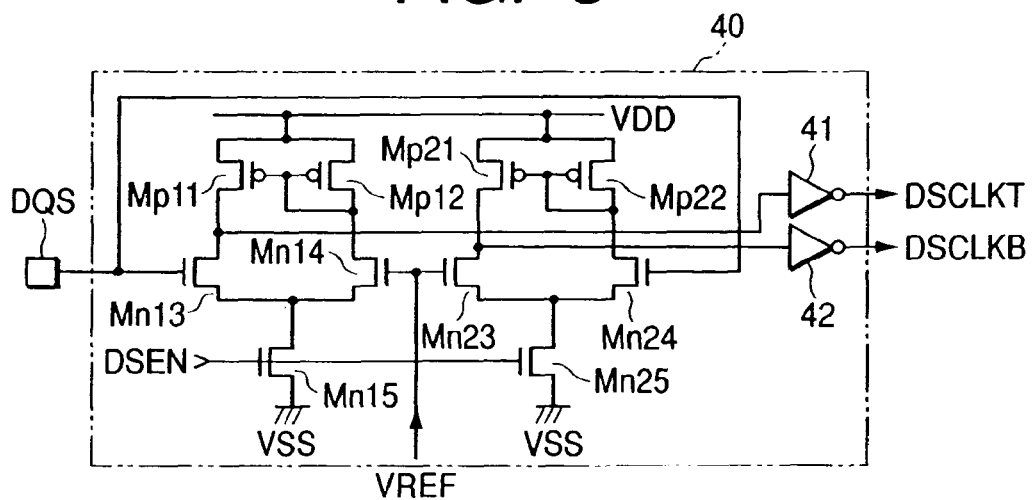
FIG. 5 is a circuit diagram illustrating a differential input buffer supplied with a data strobe signal DQS as another example of the differential input buffer based on the SSTL.

FIG. 5 shows a differential input buffer supplied with the data strobe signal DQS as another example of the differential input buffer based the SSTL. The differential input buffer 40 comprises a pair of differential amplifier circuits whose input terminals different in polarity from each other are connected to each other. Namely, one differential amplifier circuit thereof comprises a current mirror load comprised of p channel MOS transistors Mp11 and Mp12, n channel differential input MOS transistors Mn13 and Mn14, and an n channel power switch MOS transistor Mn15. The gate of the MOS transistor Mn13 serves as an inversion input terminal, and the gate of the MOS transistor Mn14 serves as a non-inversion input terminal. The other differential amplifier circuit comprises a current mirror load comprised of p channel MOS transistors Mp21 and Mp22, n channel differential input MOS transistors Mn23 and M24, and an n channel power switch MOS transistor Mn25. The gate of the MOS transistor Mn23 serves as an inversion input terminal, and the gate of the MOS transistor Mn24 serves as a non-inversion input terminal.

The data strobe signal DQS is inputted to the gates of the differential input MOS transistors Mn13 and Mn24. A reference voltage VREF is inputted to the gates of the differential input MOS transistors Mn14 and Mn23. Thus, internal clock signals DSCLKT and DSCLKB having complementary levels with respect to the data strobe signal DQS are obtained from CMOS inverters 41 and 42 respectively connected to output nodes corresponding to single ends of the differential amplifier circuits.

A signal DSEN is an enable control signal for the differential input buffer 40, which is supplied to the gates of the power switch MOS transistors Mn15 and Mn25. The differential input buffer is activated by a high level of the enable control signal DSEN. In its activated state, an operating current flows in each differential amplifier circuit, so that the differential amplifier circuit immediately amplifies a small potential difference between the reference voltage VREF and the level of a signal at the terminal DQS with the reference voltage VREF as the center. The operation of inputting the signal from the terminal DQS is carried out at high speed because of the differential amplification. The differential input buffer is deactivated by a low level of the enable control signal DSEN. In the deactivated state of the differential input buffer, no power consumption is developed in the differential amplifier circuits.

<<Data Input Circuit>>

Figure 6:
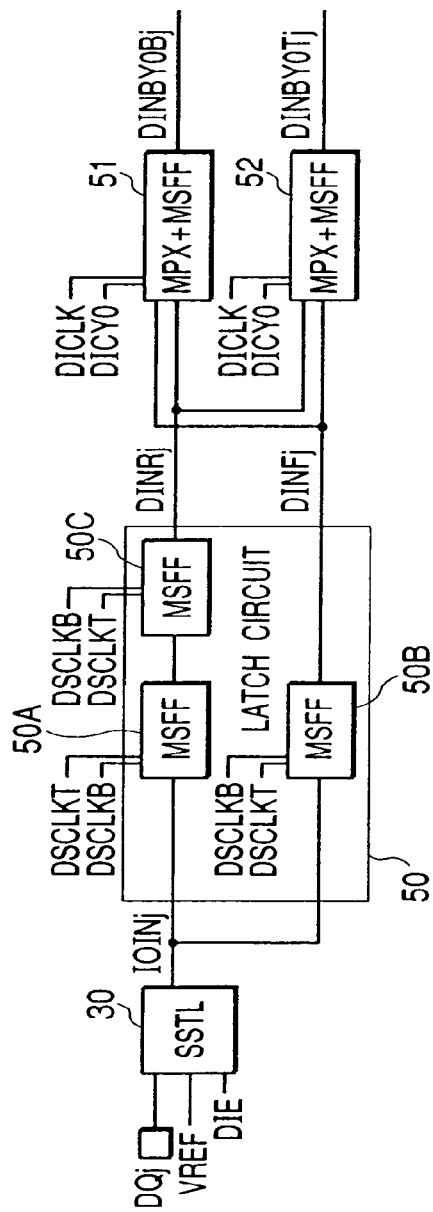
FIG. 6 is a block diagram depicting one example of a data input circuit of a DDR-SDRAM 1.

FIG. 6 shows one example of the data input circuit 3 in the DDR-SDRAM 1. The differential input buffer 30 of the SSTL specs described in FIG. 4 is disposed at a first stage. The differential input buffer 30 inputs or receives write data supplied in synchronism with the rising and falling edges of a data strobe signal DQS therein. At a stage subsequent to the differential input buffer 30, a latch circuit 50 is provided which parallelizes data supplied in units of half cycles of the data strobe signal in one cycle units of the data strobe signal and latches the same therein. The latch circuit 50 includes, for example, a first data latch 50A for latching output data of the differential input buffer 30 in synchronism with a change of the rising edge of the data strobe signal, a second data latch 50B for latching the output data of the differential input buffer 30 in synchronism with a change of the falling edge of the data strobe signal, and a third data latch 50C for latching output data of the first data latch 50A in synchronism with the change in the falling edge of the data strobe signal. Each of the data latches 50A through 50C comprises a master/slave type latch (MSFF). In the data latch 50A, DSCLKT and DSCLKB are respectively set as a latch lock for a master stage and a latch lock for a slave stage. In the data latches 50B and 50C, DSCLKB is set as the latch lock for the master stage and DSCLKT is set as the latch lock for the slave stage. The latch locks DSCLKT and DSCLKB are signals varied in synchronism with the data strobe signal DQS.

Parallel output data DINRj and DINFj of the latch circuit 50 are respectively supplied to selector latches 51 and 52. Each of the selector latches 51 and 52 selects either one of the parallel output data DINRj and DINFj according to the value of a signal DICY0 and latches the selected data therein in synchronism with a clock signal DICLK. The signal DICY0 is a signal corresponding to a logical value of the least significant bit AY0 of the column address signals (burst write leading or head addresses) supplied to the column address latch 7 from the outside. The selector latch 51 selects DINRj when DICY0 (=AY0)=0. When DICY0 (=AY0)=1, the selector latch 51 selects DINFj. Control on the selection of the selector latch 52 is opposite to the above. Thus, data in which the logical value of the least significant bit is "0", and data in which the logical value is "1" are respectively latched in the selector latches 51 and 52 regardless of the logical value of the least significant bit of the column addresses for the firstly-input write data.

The output of the selector latch 51 is connected to its corresponding memory array of each memory bank assigned to a data storage area corresponding to data in which the least significant bit of the column address signals is a logical value "0", through a signal line DINBY0Bj included in the input/output bus 2. The output of the selector latch 52 is connected to its corresponding memory array of each memory bank assigned to a data storage area corresponding to data in which the least significant bit of the column address signals is a logical value "1", through a signal line DINBY0Tj included in the input/output bus 2.

Figure 7:
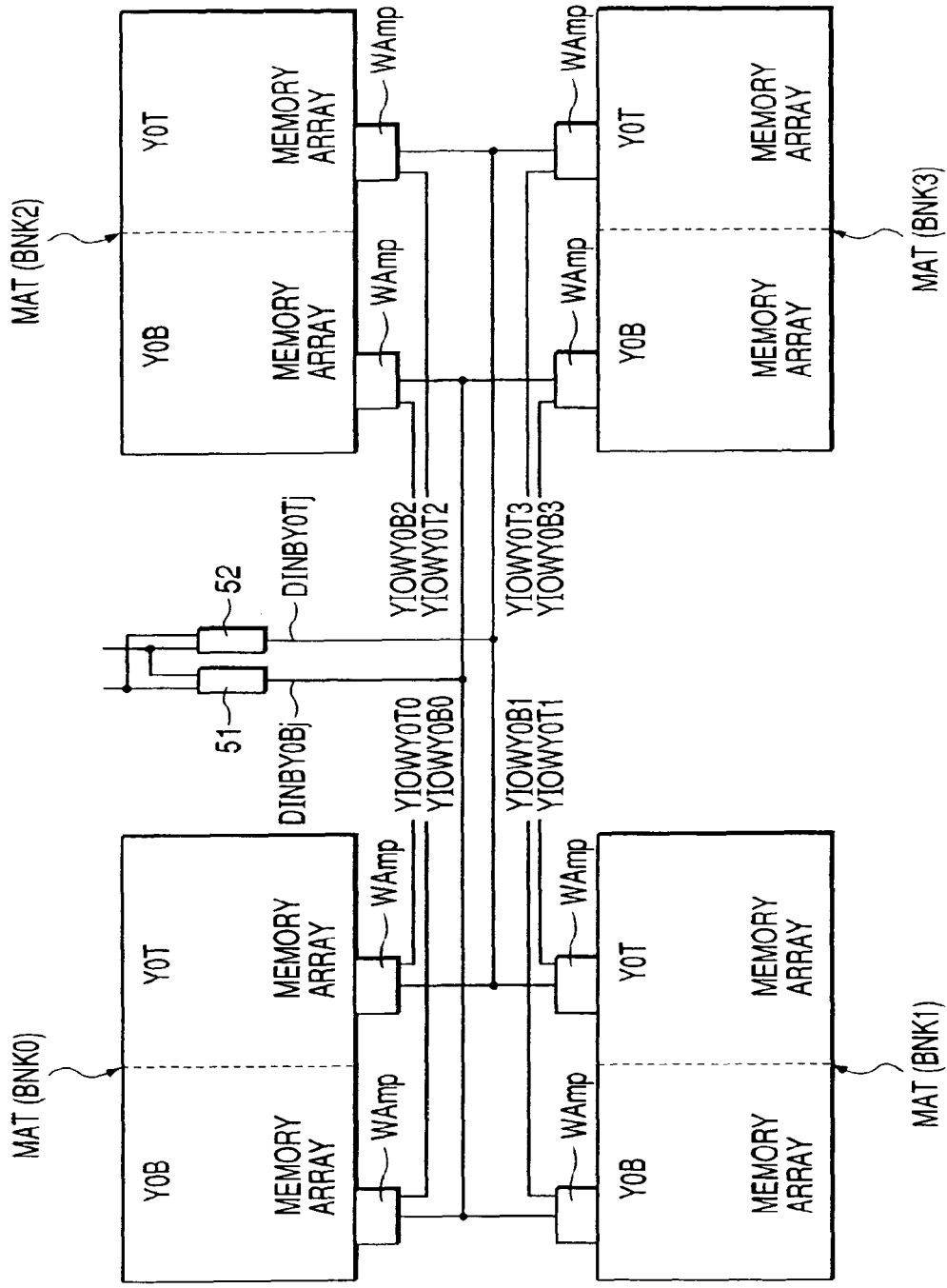
FIG. 7 is an explanatory diagram schematically showing the manner in which selector latch circuits and memory arrays of memory banks are connected to one another.

FIG. 7 schematically shows the manner in which selector latches and memory arrays of memory banks are connected to one another. In FIG. 7, one memory mat MAT is illustrated for each memory bank by way of example. A memory array Y0B of each memory mat MAT is used for storing data in which the logical value of the least significant bit of the column addresses is "0", whereas a memory array Y0T thereof is used for storing data in which the logical value of the least significant bit of the column addresses is "1". WAmp indicates write amplifiers provided for each of the memory arrays and are included in their corresponding data input/output circuits DIO0 through DIO3. YI0WY0T0 through YI0WY0T3 and YI0WY0B0 through YI0WY0B3 are respectively activation control signals for the write amplifiers WAmp.

In the DDR-SDRAM 1 as is understood from the description of the data input circuit 3, the data is inputted from outside in synchronism with both the rising and falling edges of the data strobe signal DQS synchronized with the clock signal CLK. However, the internal write operation of the DDR-SDRAM 1 is carried out with the period or cycle of the clock signal CLK as the minimum unit. While a detailed description is omitted in particular, the same relation is established between internal operation timings of the SDRAM and output operation timings thereof provided for the outside even as to a data read operation.

<<Control Circuit of DDR-SDRAM>>

Figure 8:
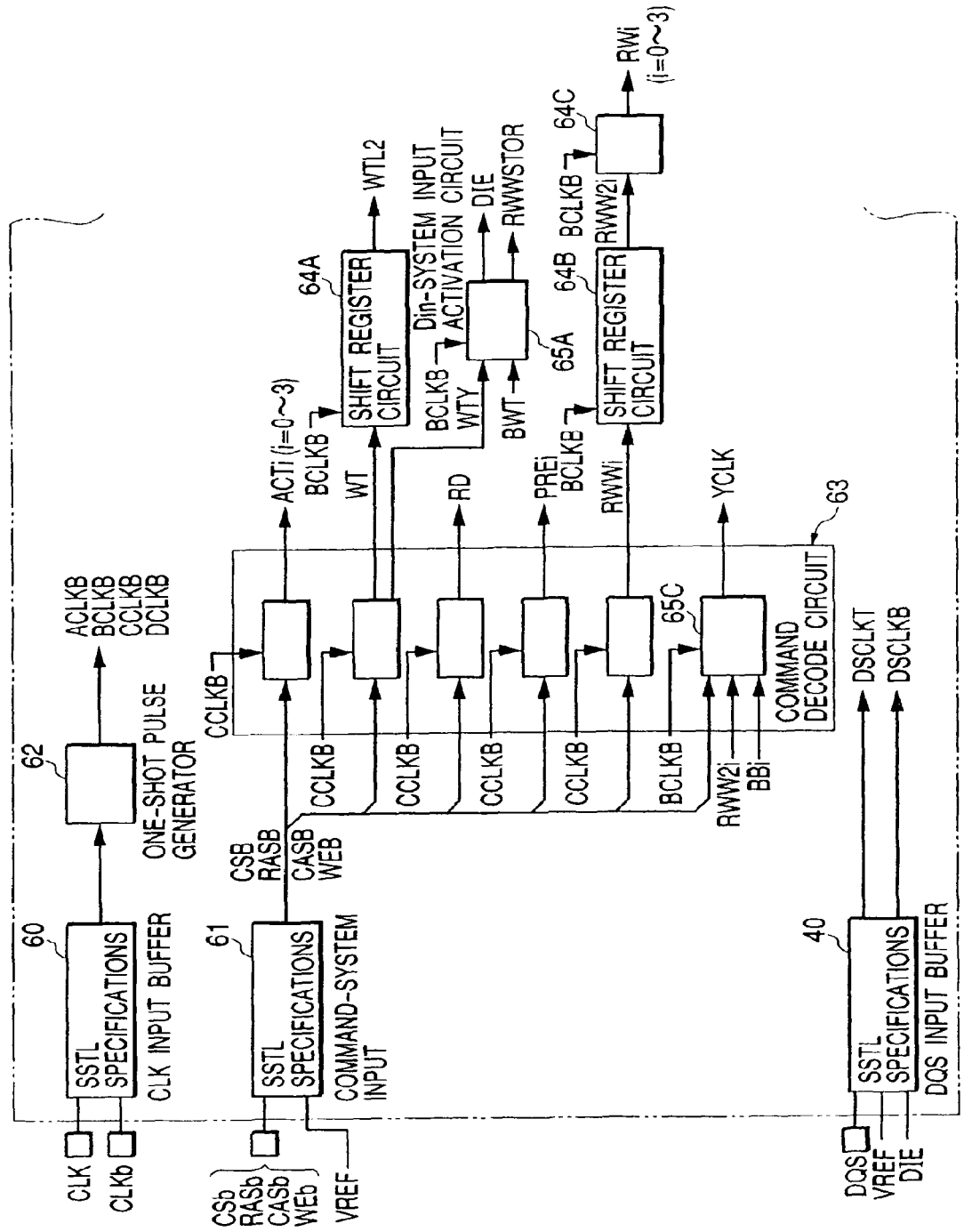
FIG. 8 is a block diagram illustrating a preceding stage of a control circuit of a DDR-SDRAM with a write control system as a principal body.
Figure 9:
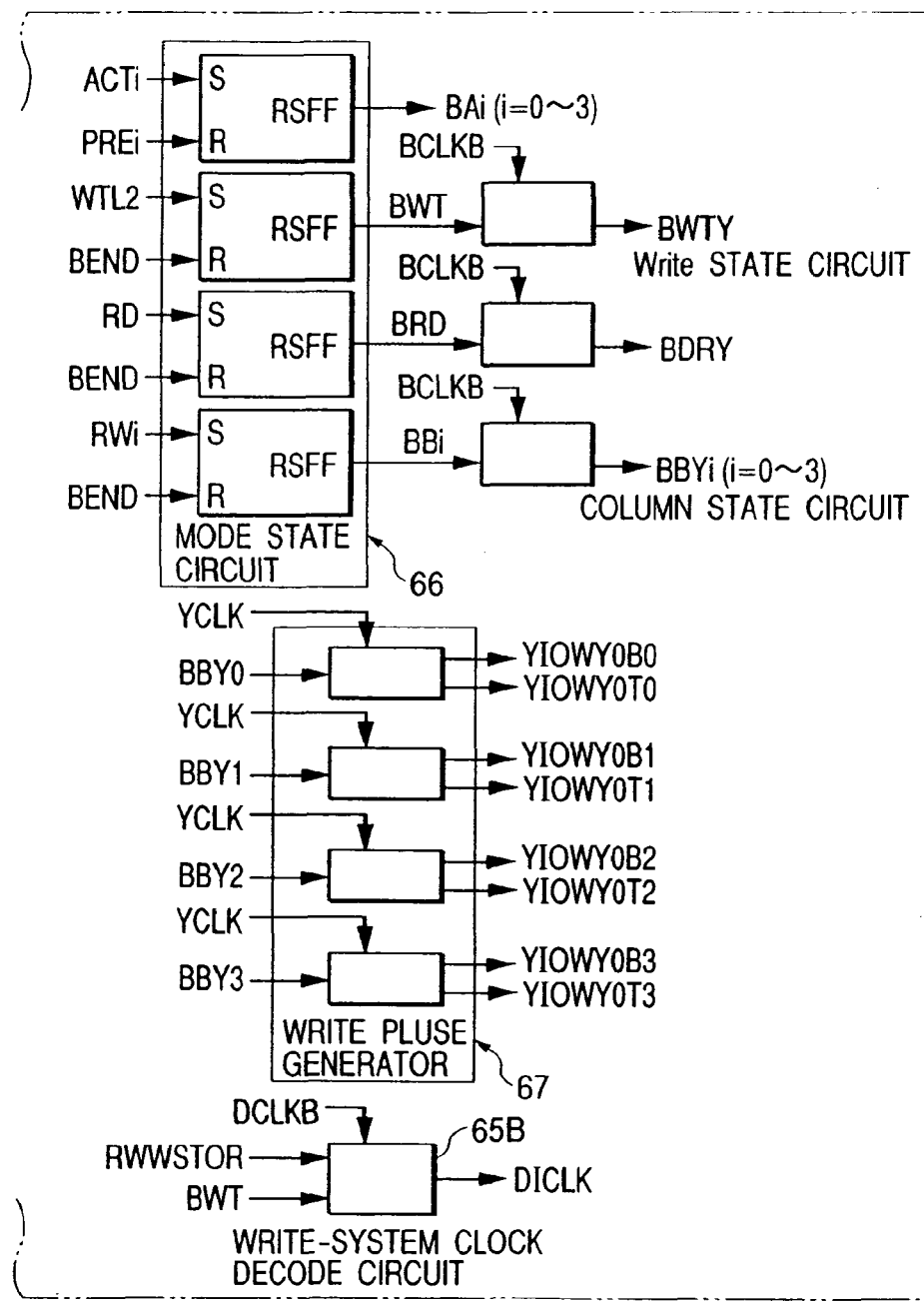
FIG. 9 is a block diagram depicting a subsequent stage of the control circuit of the DDR-SDRAM with the write control system as the main body.

FIG. 8 shows a detailed example of a preceding stage of the control circuit 12 in the DDR-SDRAM with a write control system as a main body, and FIG. 9 illustrates a detailed example of a subsequent stage of the control circuit 12 in a manner similar to FIG. 8, respectively.

Each of a clock input buffer 60, a command-system input buffer 61, and a DQS input buffer 40 is a differential input buffer of the SSTL specs. The DQS input buffer 40 is configured as shown in FIG. 5 by way of example. The CLK input buffer 60 has a differential amplifier circuit with CLK and CLKb as differential inputs, as a differential input buffer. The CLK input buffer 60 is activated by turning-on of an operating source or supply and deactivated in response to instructions for a power down mode. The command-system input buffer 61 is configured in a manner similar to the differential input buffer shown in FIG. 4 but activated by turning-on of the operating source and deactivated in response to the instructions for the power down mode.

An output produced from the CLK input buffer 60 is supplied to a one-shot pulse generator 62, from which various internal clock signals ACLKB, BCLKB, CCLKB and DCLKB are generated.

Various signals CSb, RASb, CASb and WEb inputted to the command-system input buffer 61 are decoded by a command decode circuit 63 from which internal control signals corresponding to the above operation modes are generated. ACTi is a control signal for activating each bank selected by a bank select signal when an instruction for bank active operation is provided by a bank active command. A suffix i thereof means a bank number. The suffix i thereof means that other signals are also similar to the above. WT and WTY are activated in response to instructions for a write operation by a write command. WTY is faster than WT in activation timing. A signal WTL2 is a signal obtained by delaying the signal WT by a shift register circuit 64A. RD is activated when a read operation is specified by a read command. PREi is a control signal for activating the corresponding bank selected by the bank select signal when an instruction for precharge is provided by the precharge command.

RWWi is a column selection-system reference control signal at the time that the instruction for the write operation is provided, and is defined as a signal set for each memory bank. Because column selection timing is set after the elapse of two clock cycles since the instruction for the write command upon the write operation, the signal RWWi is delayed by a shift register circuit 64B, and a one-shot pulse signal RWi synchronized with the internal clock signal BCLKB is outputted from a one-shot pulse generator 64C, based on the delayed signal RWW2i.

The results of decoding by the command decode circuit 63 are reflected on various flags (RSFF) of a mode state circuit 66 shown in FIG. 9. Each flag comprises a set/reset type flip-flop. S indicates a set terminal and R indicates a reset terminal. BAi (where i=0 to 3) indicate memory banks each indicative of an active state. BEND is a signal indicative of the end or completion of a burst operation. BBi is a signal indicative of a burst write operation being in execution. Signals BWTY, BDRY and BBYi are respectively signals latched in synchronism with the clock signal BCLKB. A write pulse generator 67 generates signals YI0WY0T0 through YI0WY0T3 and YI0WY0B0 through YI0WY0B3 for the memory arrays according to banks, based on the column state signal BBYi generated based on the signal BBi. A write clock DICLK is a signal latched in synchronism with the clock signal DCLKB, based on a signal RWWSTOR.

Figure 10:
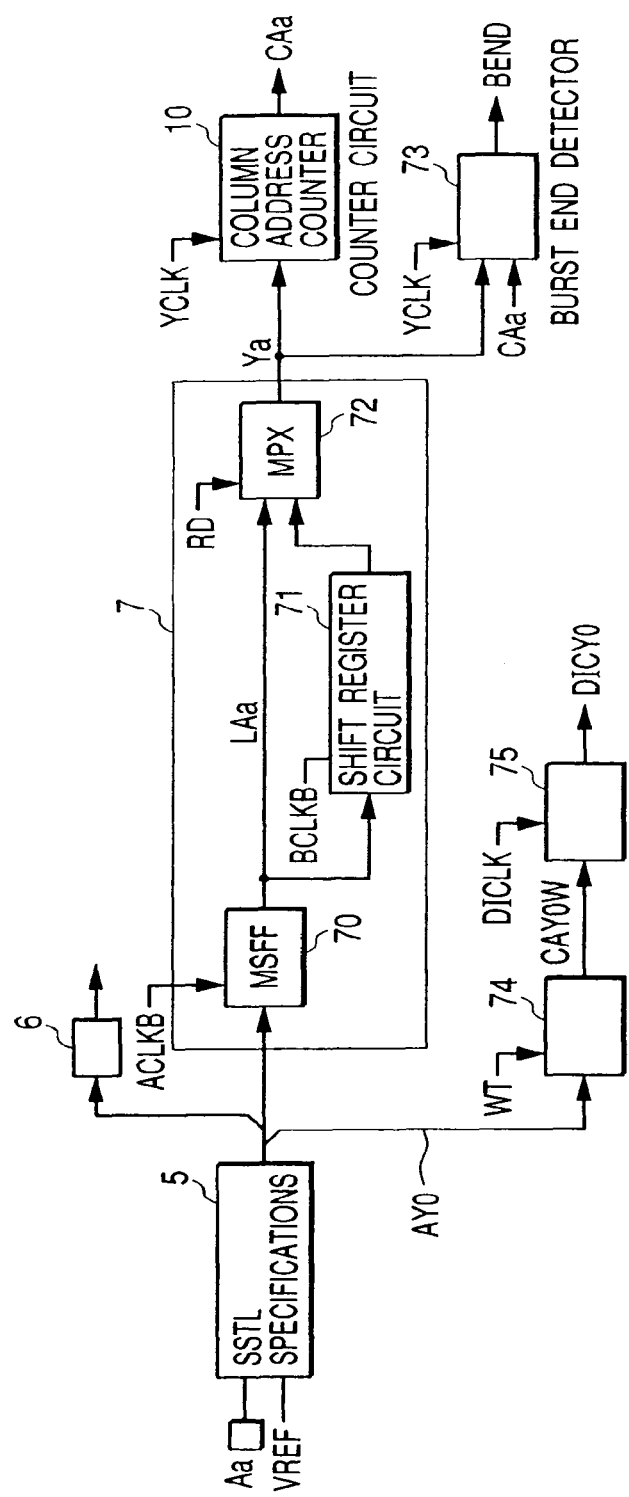
FIG. 10 is a block diagram showing a column address input system as an illustrative example.

FIG. 10 is a block diagram of a column address input system. An address buffer 5 corresponds to the differential input buffer of the SSTL specs. While the address buffer 5 is configured in a manner similar to the differential input buffer shown in FIG. 4, it is activated by turning-on of an operating supply and deactivated in response to instructions for a power down mode. A column address latch 7 has a master/slave type latch 70, a shift register circuit 71, and a multiplexer 72. Because the writing of data into each memory cell is done after the elapse of two cycles of a clock signal CLK since instruction for a write operation by a write command, an address signal delayed by the shift register circuit 71 is selected by the multiplexer 72 when the instruction for the write operation is provided. When instruction for a read operation is provided, the multiplexer 72 directly selects the output of the latch 70. The column address counter 10 performs an increment operation in synchronism with YCLK. When each address outputted from the column address counter 10 reaches the number of bursts with respect to a burst start address preset to the latch 70, a burst end detector 73 outputs a burst end signal BEND.

The column address input system has a start address latch 74 distinct from the latch 70, which holds the least significant bit AY0 of the column addresses. A select signal DICY0 corresponding to a logical value of a signal CAY0W held by the start address latch 74 is generated by a one-shot pulse generator 75 in synchronism with the clock signal DICLK.

Operation of the control circuit 12 for data writing will now be explained. When the instruction for the write operation by the write command is provided and the signal WTY is changed in pulse, the signal WTY is latched in a latch 65A in synchronism with the clock BCLKB, and the enable signal DIE of the data input buffer 30 is output high in level. Thereafter, the write data supplied in synchronism with the data strobe signal DQS is inputted to the latch circuit 50 in synchronism with the signals DSCLKT and DSCLKB outputted from the input buffer 40 as shown in FIG. 8 by way of example. A timing signal DICLK for controlling selecting operations and latch operations of the selector latches 51 and 52 (see FIG. 6) supplied with the data outputted in parallel from the latch circuit 50 is generated by a write system decode circuit 65B shown in FIG. 9. A column clock signal YCLK for controlling addresses for writing data supplied from the selector latches 51 and 52 to the input/output bus 2 in synchronism with the timing signal DICLK is outputted from a decode logic 65C in the command decode circuit 63 shown in FIG. 8. The write data is written into each column address in synchronism with the column clock signal YCLK. The end or completion of address counting of the write data corresponding to the number of bursts is detected by the burst end detector 73 shown in FIG. 10, where a burst end signal BEND is changed in pulse. The pulse change shows a state in which the generation of the final write column address for burst writing is determined, and is equivalent to the end of the write operation from the viewpoint of a column address-system operation. A signal BWT outputted from the mode state circuit 66 shown in FIG. 9 is negated in synchronism with this change. The latch 65A, which receives the signal BWT therein, negates the enable signal DIE of the data input buffer 30. Thus, the power switch MOS transistor Mn5 of the differential input buffer 30 is brought to an off state to deactivate the differential input buffer 30.

<<Write Operating Timing of DDR-SDRAM>>

Figure 11:
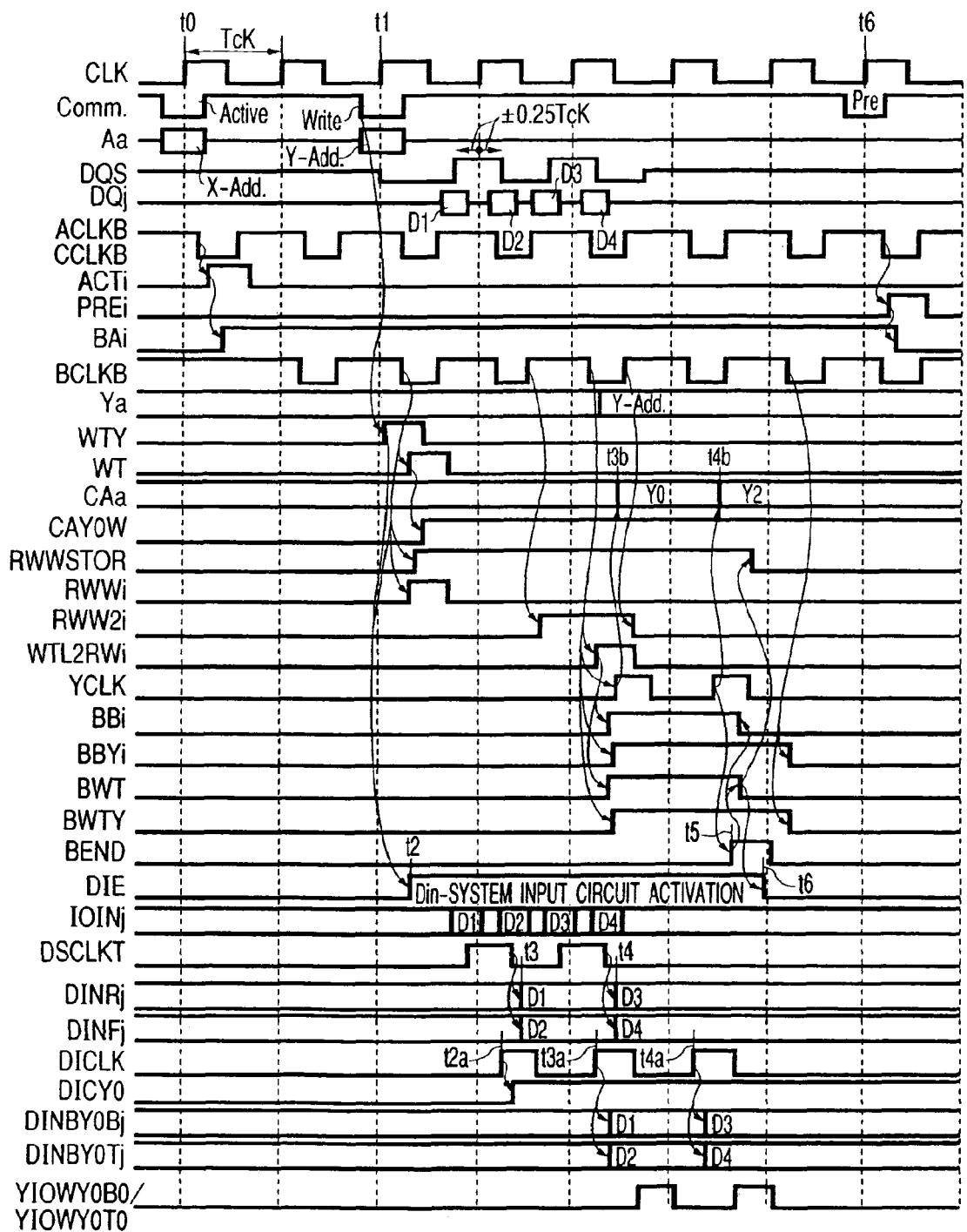
FIG. 11 is a timing chart illustrating write operating timings provided for a DDR-SDRAM 1 at the number of bursts 4.

FIG. 11 illustrates write operating timings provided for the DDR-SDRAM 1 at the number of bursts 4.

At a time t0, a row address strobe/bank active command (bank active command Active) is issued in synchronism with a clock signal CLK, and a row address signal (X-Add) is supplied. A signal ACTi for each selected memory bank is changed in pulse by the bank active command. Hence a signal BAi is asserted. Thus, although not shown in the drawing in particular, each word line corresponding to the row address signal is selected in the selected memory bank. Further, information stored in each memory cell whose select terminal is connected to the corresponding word line, is read into respective complementary bit lines, after which the information is amplified by a sense amplifier.

At a time t1, a column address/write command (Write) is issued in synchronism with the clock signal CLK and thereby a column address signal (Y-Add) is supplied. Signals WTY, WT and RWWi are successively changed in pulse according to the column address/write command. Thus, an enable control signal DIE for the differential input buffer 30 is output high in level (time t2). As a result, the differential input buffer 30 is brought from an inactive state to an active state.

At this time, a data strobe signal DQS is changed to rise within a range of an allowable error of ±0.25 Tck with respect to the rising edge of the next clock signal CLK at a time t1. For example, write data D1, D2, D3 and D4 are supplied in synchronism with respective changes in rising and falling edges of DQS. Tck indicates the cycle of the clock signal.

When the write data D1 is supplied, the differential input buffer 30 is already activated. Thus, the successively-supplied data D1 through D4 are inputted to the latch circuit 50 in synchronism with signals DSCLKT and DSCLKB outputted from the input buffer 40. The latch circuit 50 outputs D1 and D2 in parallel therefrom at a time t3, and outputs D3 and D4 in parallel therefrom at a time t4. A decision as to the selection of input of the parallel-outputted data by the selector latches 51 and 52 (see FIG. 6) is performed according to the logical value of a signal DICY0 in synchronism with the first change (time t2a) in timing signal DICLK. The write data are supplied from the selector latches 51 and 52 to the input/output bus 2 (DINBY0Bj, DINBY0Tj) according to the result of decision in synchronism with the subsequent changes (times t3a and t4a) in timing signal DICLK.

The writing of the write data supplied to the input/output bus 2 into each memory cell is carried out after the time t3a. A column address signal CAa for writing the data D1 and D2 is outputted from the column address counter 10 in synchronism with a column clock signal YCLK (time t3b). A column address signal CAa for writing the data D3 and D4 is outputted from the column address counter 10 in synchronism with a pulse change subsequent to the column clock signal YCLK (time t4b). Thus, the data D1 and D2, and D3 and D4 are written into predetermined memory cells.

The end or completion of address counting of the write data corresponding to the number of bursts is detected by the burst end detector 73, where a burst end signal BEND is changed in pulse at a time t5. The pulse change shows a state in which the generation of the final write column address for burst writing is determined, and is equivalent to the end or completion of the write operation from the viewpoint of a column address-system operation. A signal BWT outputted from the mode state circuit 66 shown in FIG. 9 is negated in synchronism with this change. The latch 65A, which receives the signal BWT therein, negates the enable signal DIE of the data input buffer 30. As a result, the differential input buffer 30 is brought into an inactive state.

Figure 12:
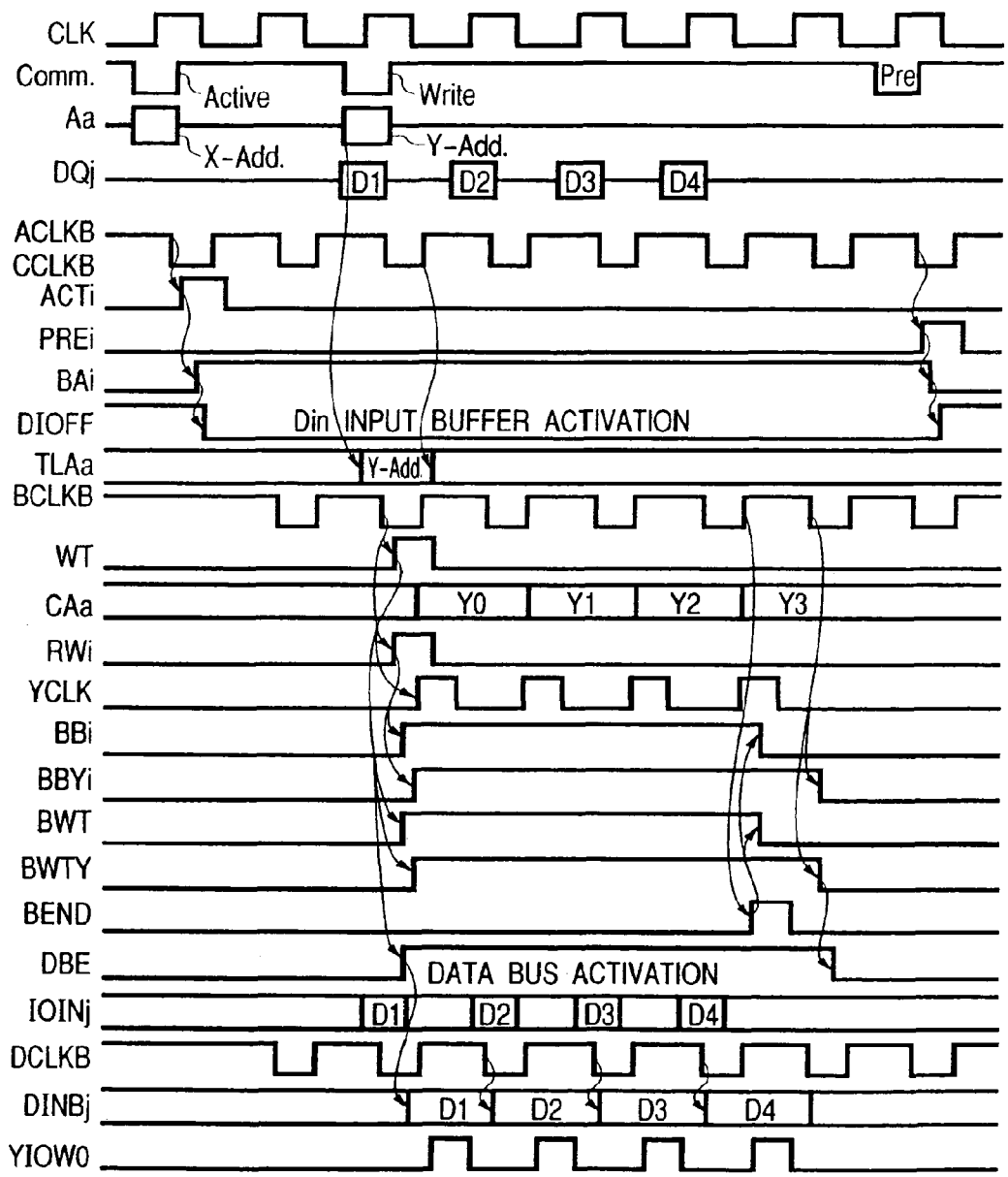
FIG. 12 is a timing chart depicting write operating timings provided for an SDR-SDRAM as a comparative example of FIG. 11.

FIG. 12 shows write operating timings provided for an SDR-SDRAM as a comparative example of FIG. 11. The SDR-SDRAM is supplied with write data together with a column address/write command in synchronism with a clock signal CLK. Therefore, the activation of a data input buffer after instruction for a write operation by a write command will not suffice. To this end, an enable signal DIOFF for the data input buffer is output low in level in synchronism with instruction (pulse change in signal ACTi) for a row address system operation by a bank active command, whereby the data input buffer is activated. This condition is maintained until a precharge operation is next specified by a precharge command (Pre) (until pulse change in signal PREi). Thus, since the operation of the data input buffer is unnecessary until writing based on the write command is indicated after a bank active operation, until the precharge operation is specified after the completion of the write operation, and when only a read command is issued and no write command is issued after the bank active operation, the data input buffer is being kept active during that time, thereby causing wasteful power consumption. If such control on the activation of the data input buffer is applied to the DDR-SDRAM 1 as it is, power is expected to be wastefully consumed compared with the DDR-SDRAM 1 shown in FIG. 1 because of SSTL interface specs of the data input buffer.

Figure 13:
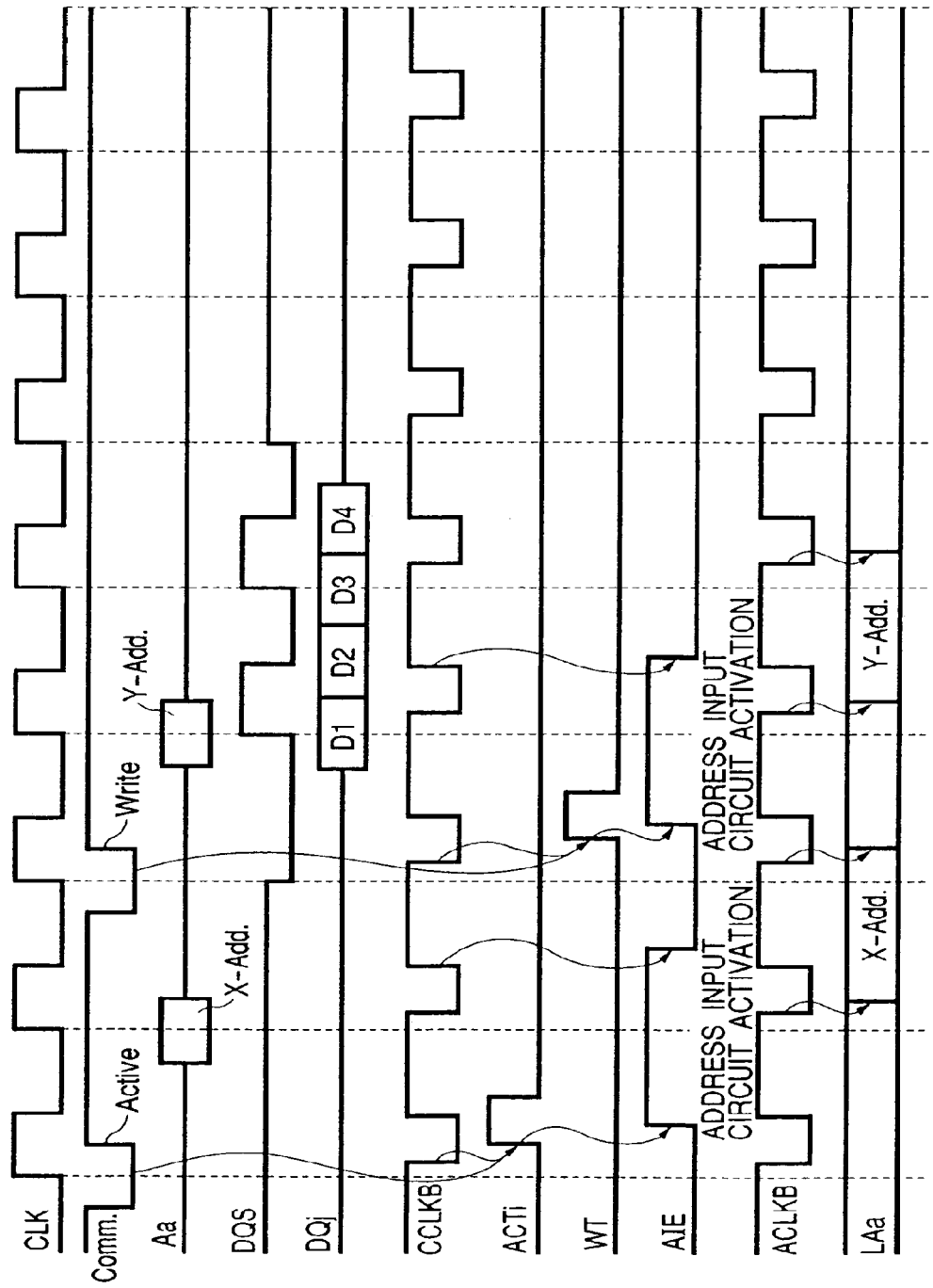
FIG. 13 is a timing chart showing operating timings at the time that the present invention is applied to an address input buffer.

FIG. 13 is an operation timing chart at the time that the present invention is applied to an address input buffer. An example shown in FIG. 13 is one which supposes or considers the specs that address input timing for the DDR-SDRAM shown in FIG. 1 is delayed by one cycle of a clock signal CLK as counted from the input of a command. Namely, as illustrated in FIG. 13 by way of example, timing for row address strobe is provided with a delay of one cycle of the clock signal CLK after a bank active command (Active) and thereby a row address signal (X-Add) is supplied. Timing for column address strobe is provided with a delay of one cycle of the clock signal CLK after a column address/write command (Write) and thereby a column address signal (Y-Add) is supplied. An activation control signal AIE for the address input buffer is output in synchronism with a pulse change in signal ACTi by bank active instructions, a pulse change in signal WT by instructions for a write operation by a write command, and a pulse change in read signal by instructions for a read operation by a column address/read command although not shown in the drawing, respectively, thereby activating the address input buffer. The deactivation of the address input buffer may be performed while waiting for timing provided to complete an address input operation by the address input buffer. For example, it may be synchronized with a predetermined change in column system clock signal CCLKB.

If control for activating the address input buffer is effected thereon after the execution of instructions for operation, then power consumed by the address input buffer of the SSTL specs can be reduced.

While the invention made by the present inventors has been described above specifically by the embodiments, the present invention is not necessarily limited to the same. It is needless to say that various changes can be made to the invention within the range not departing from the substance thereof.

For example, the input buffer activated and controlled after the execution of the instructions for operation, is not limited to the data and address input buffers. It may be other control signal input buffers. Further, the SSTL specs-based input buffers are not limited to the differential input buffers described in FIGS. 4 and 5 and may suitably be changed. Further, control logic for generating an enable control signal DIE for a data input buffer or logic for generating an intermediate signal for producing it is not limited to the above and may suitably be changed. The number of data input/output terminals for the SDRAM is not limited to 16 bits and may be set to 8 bits, 4 bits or the like. The number of the memory banks for the SDRAM, and the configurations of the memory mat and memory array in each memory bank are not limited to the above and may suitably be changed.

The above description has been made of the case in which the invention principally made by the present inventors has been applied to the DDR-SDRAM which corresponds to a field defined as the background of the invention. However, the present invention is not limited to it. The DDR-SDRAM can widely be applied to a semiconductor device called an on-chip microcomputer, a system LSI or an accelerator or the like, for example.

Advantageous effects obtained by typical implementations of the invention in the present application will be described in brief as follows.

Namely, in a semiconductor device having a data input buffer capable of inputting write data to each of memory units, the data input buffer is changed from an inactive state to an active state after having accepted instruction for writing of the data into the memory unit. The data input buffer is a differential input buffer having interface specs based on an SSTL standard, for example. The differential input buffer allows a through current to flow in its active state and receives a signal while immediately following a small change in a small-amplitude signal. Since such an input buffer is brought to an active state only when instruction for the writing of the data into the memory unit is given thereto, wasteful power consumption that would occur by the data input buffer being brought to the active state in advance before the instruction for the write operation is provided, can be avoided.

In the case of an SDRAM indicative of a preferred embodiment of the semiconductor device, instruction provided by a bank active command or a read command does not activate a data input buffer. Therefore, if a write command is not provided after a bank active operation, then the data input buffer causes no wasteful power consumption.

Control of an input buffer as judged from the viewpoint similar to the data input buffer can be applied even to an address input buffer, etc. After the reception of the bank active command, the read command or the write command, the address input buffer is changed from an inactive state to an active state. Thereafter, the address input buffer is changed from the active state to the inactive state after the elapse of a predetermined cycle period synchronized with the clock signal.

From the above, a semiconductor device can be provided which is capable of reducing power consumption made by an external interface buffer such as a data input buffer or the like.

What is claimed is:

1. A semiconductor memory device, comprising:
data terminals which receive data;
input buffers each of which is coupled to a corresponding one the data terminals;
memory banks, each of which includes a plurality of memory cells, to store data received via the data terminals;
a clock terminal which receives a clock signal; and
a strobe terminal which receives a data strobe signal, the data being inputted via the data terminals in synchronism with both rising and falling edges of the data strobe signal,
wherein the input buffers are changed from an inactive state to an active state after the semiconductor device receives a write instruction for storing data to one of the memory banks, and are changed from the active state to the inactive state after elapse of a predetermined time period,
wherein a respective through current of each input buffer is smaller in the inactive state than in the active state,
wherein the predetermined time period is synchronized with the clock signal and
wherein each of the input buffers includes a differential buffer having a power switch, and is changed to the active state by turning on the power switch and changed to the inactive state by turning off the power switch.

2. A semiconductor memory device according to claim 1,
wherein the differential buffer has an input terminal for receiving an input enable signal, and
wherein, the input enable signal controls the power switch depending upon whether the associated input buffer is to be set to the active state or the inactive state.

* * * * *